United States Patent
Suzuki et al.

(10) Patent No.: US 9,093,484 B2
(45) Date of Patent: Jul. 28, 2015

(54) MANUFACTURING APPARATUS AND METHOD FOR SEMICONDUCTOR DEVICE

(75) Inventors: Kunihiko Suzuki, Shizuoka-ken (JP); Yoshikazu Moriyama, Izu (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 529 days.

(21) Appl. No.: 12/853,107

(22) Filed: Aug. 9, 2010

(65) Prior Publication Data

US 2011/0039399 A1 Feb. 17, 2011

(30) Foreign Application Priority Data

Aug. 12, 2009 (JP) ................................. 2009-187390

(51) Int. Cl.
*C23C 16/458* (2006.01)
*C23C 16/46* (2006.01)
*H01L 21/67* (2006.01)
*H01L 21/683* (2006.01)
*H01L 21/687* (2006.01)
(Continued)

(52) U.S. Cl.
CPC ...... *H01L 21/67109* (2013.01); *C23C 16/4586* (2013.01); *C23C 16/46* (2013.01); *C30B 25/04* (2013.01); *C30B 25/14* (2013.01); *C30B 25/18* (2013.01); *C30B 33/12* (2013.01); *H01L 21/68785* (2013.01); *H01L 21/68792* (2013.01)

(58) Field of Classification Search
CPC  C23C 16/4586; C23C 16/4582; C23C 16/46; H01L 21/67109; H01L 21/68792; H01L 21/67103; H01L 21/68785; C30B 25/18; C30B 25/04; C30B 33/12; C30B 25/14

USPC ......................................... 118/715, 725, 730
See application file for complete search history.

(56) References Cited

U.S. PATENT DOCUMENTS 5,328,722 A * 7/1994 Ghanayem et al. ........... 427/250
5,997,651 A * 12/1999 Matsuse et al. ............... 118/725
(Continued)

FOREIGN PATENT DOCUMENTS

JP      61281099 A  * 12/1986  .............. C30B 25/14
JP   2005-183494 A    7/2005
(Continued)

OTHER PUBLICATIONS

Notification of Reason(s) for Refusal issued in Japanese Patent Application No. 2009-187390 mailed on Feb. 5, 2013.

*Primary Examiner* — Jeffrie R Lund
(74) *Attorney, Agent, or Firm* — Finnegan, Henderson, Farabow, Garrett & Dunner, L.L.P.

(57) ABSTRACT

A manufacturing apparatus for a semiconductor device includes: a chamber configured to load a wafer into the chamber; a gas supplying mechanism configured to supply processed gas into the chamber; a gas discharging mechanism configured to discharge the gas from the chamber; a wafer supporting member configured to mount the wafer; a heater including a heater element configured to heat the wafer up to a predetermined temperature and a heater electrode molded integrally with the heater element; an electrode part connected to the heater electrode and configured to applied a voltage to the heater element via the heater electrode; a base configured to fix the electrode part; and a rotational drive control mechanism configured to rotate the wafer; wherein at least a part of a connection portion of the heater electrode and the electrode part is positioned under the upper surface of the base.

13 Claims, 2 Drawing Sheets

(51) Int. Cl.
*C30B 25/04* (2006.01)
*C30B 25/14* (2006.01)
*C30B 25/18* (2006.01)
*C30B 33/12* (2006.01)

(56) References Cited

U.S. PATENT DOCUMENTS

| | | | |
|---|---|---|---|
| 6,200,388 B1* | 3/2001 | Jennings | 118/728 |
| 6,583,064 B2* | 6/2003 | Wicker et al. | 438/710 |
| 6,726,801 B2* | 4/2004 | Ahn | 156/345.29 |
| 6,837,966 B2* | 1/2005 | Nishimoto et al. | 156/345.29 |
| 2007/0221657 A1* | 9/2007 | Arai et al. | 219/501 |
| 2010/0055351 A1* | 3/2010 | Kato et al. | 427/595 |
| 2011/0039399 A1* | 2/2011 | Suzuki et al. | 438/478 |
| 2011/0092075 A1* | 4/2011 | Suzuki et al. | 438/758 |
| 2012/0071000 A1* | 3/2012 | Arai | 438/758 |
| 2012/0291697 A1* | 11/2012 | Suzuki et al. | 117/98 |
| 2012/0325138 A1* | 12/2012 | Suzuki et al. | 117/88 |
| 2013/0036968 A1* | 2/2013 | Suzuki et al. | 117/107 |
| 2013/0084390 A1* | 4/2013 | Suzuki et al. | 427/248.1 |

FOREIGN PATENT DOCUMENTS

| | | |
|---|---|---|
| JP | 2007-288163 | 11/2007 |
| JP | 2008-244390 | 10/2008 |

* cited by examiner

MANUFACTURING APPARATUS AND METHOD FOR SEMICONDUCTOR DEVICE

CROSS-REFERENCE TO RELATED APPLICATION

This application is based upon and claims the benefit of priority from the prior Japanese Patent Application No. 2009-187390 filed on Aug. 12, 2009, the entire contents of which are incorporated herein by reference.

BACKGROUND OF THE INVENTION

The present invention relates to a manufacturing apparatus and method for a semiconductor device, for example, used for forming a film by supplying a reaction gas to the surface of a semiconductor wafer while heating the rear surface of the semiconductor wafer.

In recent years, as a semiconductor device is requested to realize lower price and higher performance, higher productivity in film forming process of a wafer and higher quality such as improvement in uniformity in film thickness is also required.

To satisfy such requirements, a back heating method is employed, which uses a single-wafer-processing epitaxial growth apparatus, supplies process gas while rotating a wafer at high speed of 900 rpm or higher in a chamber, and heats the wafer from the rear surface by using a heater.

Generally, a heater element constituting a heater is fixed and connected to an electrode part serving as a supporter within its plane by using a bolt or the like. However, heat induces deformation at a connection portion and an increase in resistance accordingly. In view of this, Japanese Patent Application Laid-open No. 2007-288163 (FIGS. 1 and 2 and the like) discloses a heater electrode integrated with a heater element is provided in such a manner as to be connected to an electrode part under the heater element.

SUMMARY

A semiconductor manufacturing apparatus in one aspect of the present invention includes: a chamber configured to load a wafer into the chamber; a gas supplying mechanism configured to supply processed gas into the chamber; a gas discharging mechanism configured to discharge the gas from the chamber; a wafer supporting member configured to mount the wafer; a heater including a heater element configured to heat the wafer up to a predetermined temperature and a heater electrode molded integrally with the heater element; an electrode part connected to the heater electrode and configured to applied a voltage to the heater element via the heater electrode; a base configured to fix the electrode part; and a rotational drive control mechanism configured to rotate the wafer; wherein at least a part of a connection portion of the heater electrode and the electrode part is positioned under the upper surface of the base.

A semiconductor manufacturing method in one aspect of the present invention includes: loading a wafer in a chamber; applying a voltage, via a electrode part connected to a heater electrode at a connection portion under the upper end of the electrode part, to the heater element molded integrally with the heater electrode to generate heat to heat the wafer at a predetermined temperature; and rotating the wafer and supplying processed gas onto the wafer, to form a film on the wafer.

DETAILED DESCRIPTION

Reference will now be made in detail to the present embodiment of the invention, an example of which is illustrated in the accompanying drawings.

As described above, in a manufacturing apparatus for a semiconductor device, a heater electrode integrated with a heater element is provided in such a manner as to be connected to an electrode part under the heater element. At this time, the heater electrode is made of SiC doped with impurities whereas the electrode part is made of carbon containing impurities. Both of the heater electrode and the electrode part are subjected to SiC coating in order to prevent diffusion of the impurities. The heater electrode and the electrode part are connected near the middle between a base and a susceptor for fixing electronic parts or the like for the purpose of connection stability and fixing facility.

However, these connection portions (i.e., joint ends) are not subjected to coating in order to secure conductivity. Moreover, in order to keep the treatment temperature of a wafer at about 1100° C., the temperature at the connection portion need be kept within a range of 700° C. to 900° C. Therefore, the impurities are diffused at the connection portion, thereby contaminating the wafer. Preferred embodiments below have been accomplished to solve such a problem.

First Embodiment

Figure 1:
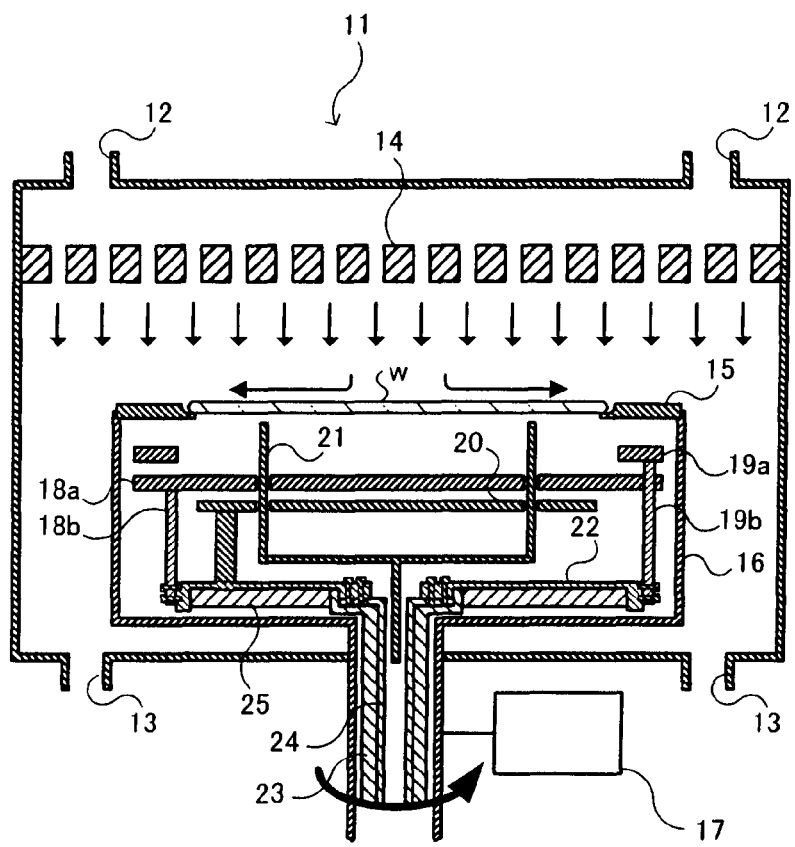
FIG. 1 is a cross-sectional view showing a manufacturing apparatus for a semiconductor device in one aspect of the present invention.

FIG. 1 is a cross-sectional view showing an epitaxial growth apparatus as a semiconductor manufacturing apparatus in the present embodiment. As shown in FIG. 1, in a chamber 11 in which a wafer w having a diameter of, for example, 200 mm is subjected for film forming process, gas supply ports 12 connected to a gas supply mechanism (not shown) for supplying process gas containing a source gas such as trichlorosilane or dichlorosilane onto the wafer w at a predetermined flow rate from above the chamber 11 are provided. In a lower part of the chamber 11, gas discharge ports 13 connected to a gas discharge mechanism (not shown) for discharging gas to control the pressure in the chamber 11 to predetermined pressure (ordinary pressure) are provided in two places.

Rectifying plates 14 for supplying the processed gas supplied through the gas supply ports 12 onto the wafer w in a rectified state are provided in the upper portion of the chamber 11. Under the rectifying plates 14, a susceptor 15 functioning as a holding member for holding the wafer w on a ring 16 serving as a rotating member is disposed. The ring 16 is connected to a rotational drive control mechanism 17 constituted of a rotary shaft (not shown) for rotating the wafer w at a predetermined rotational speed, a motor (not shown) and the like.

Inside of the ring 16 are housed an in-heater 18 and an out-heater 19 for heating the wafer w made of, for example, SiC. Under these heaters is disposed a disk-like reflector 20 for efficiently heating the wafer w. Additionally, a pushing-up shaft 21 is provided for vertically moving the wafer w in such a manner as to pierce the in-heater 18 and the reflector 20.

Figure 2:
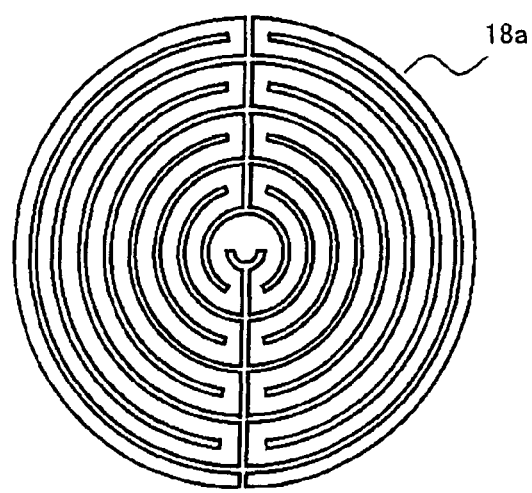
FIG. 2 is a diagram illustrating a heater pattern in one aspect of the present invention.

The in-heater 18 includes a heater element 18a having a predetermined pattern illustrated in FIG. 2 and a heater electrode 18b molded integrally with the heater element 18a. In contrast, the out-heater 19 includes an annular heater element 19a and a heater electrode 19b molded integrally with the heater element 19a. The basic material of each of the heater electrodes 18b and 19b is conductive SiC which is doped with impurities such as $N_2$. Furthermore, each of the heater electrodes 18b and 19b is coated with a high-purity SiC film.

At the lower portion inside of the ring 16, booth bars 22 serving as an electrode part to be connected to the heater electrodes 18b and 19b by using bolts or the like are disposed. The connection portion between electrode part and the heater electrode disposed under the upper end of the electrode part. The basic material of the booth bars 22 are carbon having conductivity, and further, the booth bar 22 is coated with a high-purity SiC film. Connection portion between the heater electrodes 18b and 19b and the booth bar 22 are not coated with the SiC film. The booth bar 22 is connected to an exterior power source (not shown) and further, by using bolts or the like to an electrode 24 to be fixed to a heater shaft 23.

Under the booth bar 22, for example, a quartz base 25 is disposed. To the base 25 are fixed the supporter of the reflector 20 and the booth bar 22. Cutouts are formed at the base 25 such that at least a part of the connection portion between each of the heater electrodes 18b and 19b and the booth bar 22 is lower than the upper surface of the base 25.

The position of the connection portion between each of the heater electrodes 18b and 19b and the booth bar 22 is preferably located such that the distance between the upper end and a wafer supporting surface of the susceptor 15 should be ranged 0.5 to 1.5 times of the diameter of the wafer w. If the distance is less than 0.5 time, the temperature at the connection portion becomes too high. In contrast, if the distance is more than 1.5 times, the volume of the apparatus is increased, and degrading the holding stability by the heater.

With the above-described semiconductor manufacturing apparatus, an Si epitaxial film is formed on the Si wafer w of, for example, φ200 mm.

First, the wafer w is loaded into the chamber 11. The susceptor 15 having the wafer w mounted thereon is placed on the ring 16 by descending the pushing-up shaft 21. And then, the electrode 23 connected to the exterior power source (not shown) applies a voltage to each of the heater electrodes 18b and 19b connected to the booth bars 22 at the cutouts at the base 25, so as to control the in-heater 18 and the out-heater 19 in such a manner as to make the in-planar temperature of the wafer w uniform at, for example, 1100° C.

Thereafter, the wafer w is rotated by the rotational drive control mechanism 17 at, for example, 900 rpm, and further, the processed gas is supplied onto the wafer w through the gas supply ports 12 in the rectified state via the rectifying plates 14. The processed gas is prepared such that the concentration of trichlorosilane is adjusted to, for example, 2.5%, and for example, is supplied at 50 SLM.

In the meantime, gases such as excessive gas of the processed gas containing trichlorosilane and dilute gas, and HCl as a reaction by-product are discharged downward from periphery of the susceptor 15. In addition, the gases are discharged through the gas discharge ports 13 via the gas discharging mechanism (not shown) so that the pressure inside of the chamber 11 is controlled to be constant (for example, at an ordinary pressure). In this manner, the Si epitaxial film is grown on the wafer w.

The heater electrode and the booth bar have been conventionally connected to each other in the middle of the susceptor because of the connection stability and the fixing facility. However, since the treatment temperature of the wafer is kept in a range from 900° C. to 1200° C. from the surface of the susceptor on which the wafer is placed to the position of less than 0.5 times (in the present preferred embodiment, 10 cm) of the diameter of the wafer, the temperature of the connection portion need be substantially kept within a range from 700° C. to 900° C. The connection portion is descended near the position of the base where the temperature need not be kept, so that the temperature of the connection portion can be reduced to 500-700° C. Consequently, it is possible to suppress the diffusion of the impurities from the connection portion, so as to restrain the contamination of the wafer. As a result, a switching speed can be increased or a leakage current can be reduced in a semiconductor device which is formed by using the above-described wafer.

Second Preferred Embodiment

The configuration of a semiconductor manufacturing apparatus in the present preferred embodiment is identical to that in the first preferred embodiment except that a separation plate is disposed on a connection portion between a heater electrode and a booth bar.

Figure 3:
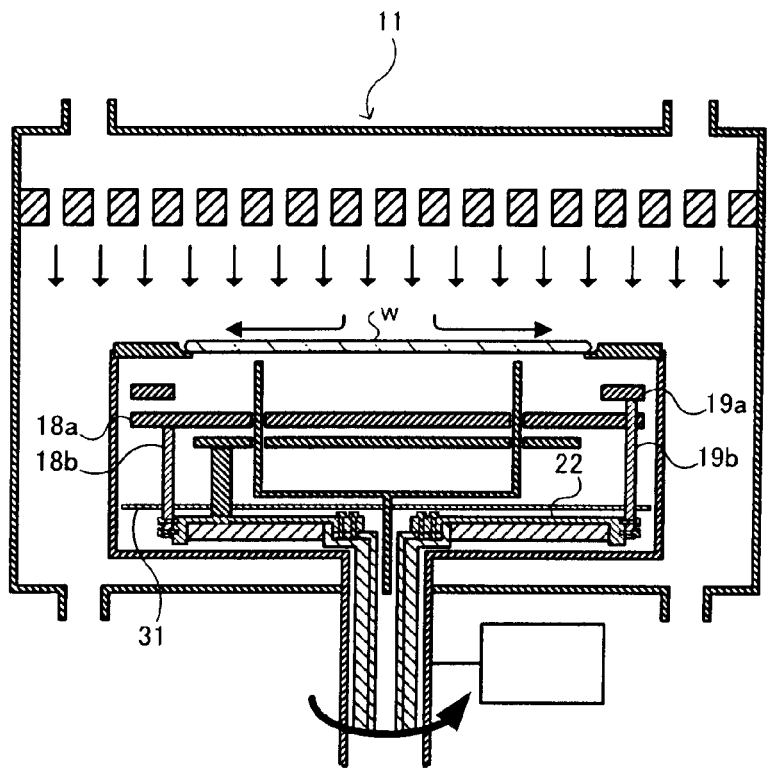
FIG. 3 is a cross-sectional view showing a manufacturing apparatus for a semiconductor device in another aspect of the present invention.

Specifically, as shown in FIG. 3, a separation plate 31 is disposed in such a manner as to partition each connection portion between heater electrodes 18b and 19b and booth bars 22 from heater elements 18a and 19a. The separation plate 31 has a center portion and openings through which the heater electrodes 18b and 19b, a supporter for a reflector, and the like penetrate.

Even if impurities are diffused from the connection portions, the impurities never reach the heater electrodes 18b and 19b by providing such a separation plate, and therefore, contamination of a wafer can be more suppressed than in the first preferred embodiment. Consequently, like in the first preferred embodiment, a switching speed can be more increased or a leakage current can be more reduced in a semiconductor device which is formed by using the above-described wafer.

Figure 4:
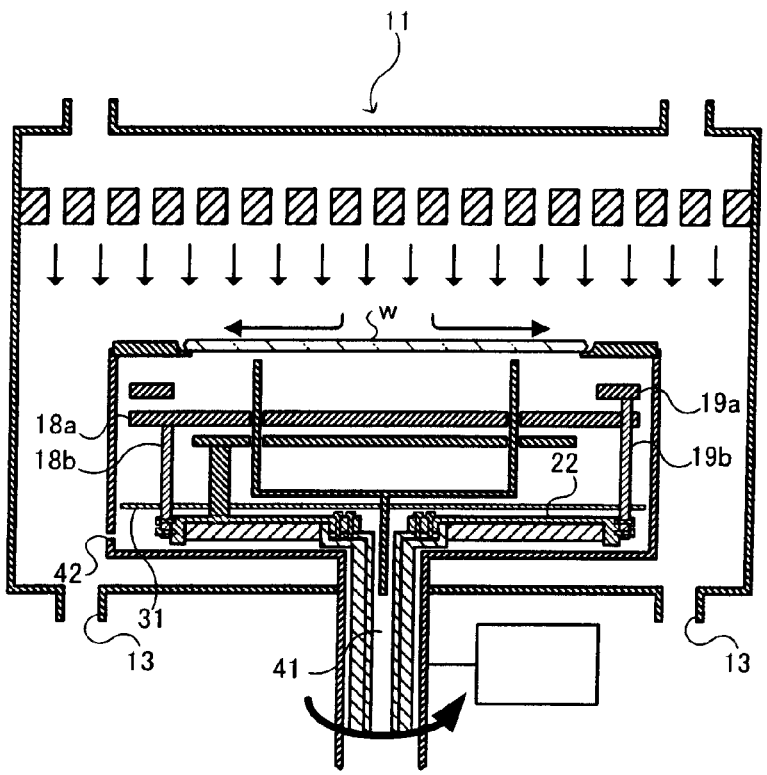
FIG. 4 is a cross-sectional view showing a manufacturing apparatus for a semiconductor device in a further aspect of the present invention.

Furthermore, it is preferable that a region under the separation plate 31 should be purged with $H_2$ or inert gas such as Ar. Specifically, as shown in FIG. 4, a purge gas inlet 41 and a purge gas outlet 42 are disposed in the region under the separation plate 31. The purge gas such as $H_2$ contained in dilute gas such as processed gas is introduced through the purge gas inlet 41, and then, is discharged outside of a heater unit (i.e., the ring 16) through the purge gas outlet 42 in such a manner as to prevent any circulation of the purge gas toward heater elements. The discharged purge gas is discharged outside of a chamber 11 through gas discharge ports 13. In this manner, it is possible to more suppress contamination of a wafer.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 μm or more in an N-type base region, P-type base region or an insulation isolation region, satisfactory element characteristics can be obtained.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of an $SiO_2$ film and an $Si_3N_4$ film, and in the case of $SiO_2$ film, monosilane ($SiH_4$) and gases of $N_2$, $O_2$, and Ar are fed, and in the case of $Si_3N_4$ film, monosilane ($SiH_4$) and gases of $NH_3$, $N_2$, $O_2$, and Ar are fed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for a semiconductor device comprising:
    a chamber configured to receive a wafer loaded therein;
    a gas supplying mechanism configured to supply processed gas into the chamber;
    a gas discharging mechanism configured to discharge the processed gas from the chamber;
    a wafer supporting member configured to mount the wafer;
    a heater including a heater element and a heater electrode, wherein the heater element is configured to heat the wafer up to a predetermined temperature, and the heater electrode projects from a rear surface of the heater element and is molded integrally with the heater element;
    an electrode configured to a voltage from outside;
    a heater shaft configured to fix the electrode;
    an electrode part, one end of which is connected to a lower end of the heater electrode at a first section of the electrode part and the other end of which is connected to an upper end of the electrode at a second section of the electrode part, wherein the electrode part is provided in the chamber and is configured to apply a voltage to the heater element via the heater electrode;
    a base configured to fix the electrode part directly at an upper surface of the base, the first section being positioned under the upper surface of the base; and
    a rotational drive control mechanism configured to rotate the wafer.

2. The manufacturing apparatus for a semiconductor device according to claim 1, wherein a distance between the upper end of the surface of the heater electrode that touches the electrode part and the wafer supporting surface of the wafer supporting member ranges from 0.5-1.5 times of the diameter of the wafer.

3. The manufacturing apparatus for a semiconductor device according to claim 1, wherein the base has a cutout.

4. The manufacturing apparatus for a semiconductor device according to claim 1, wherein each of the heater electrode and the electrode part has a conductive substrate coated with an SiC film.

5. The manufacturing apparatus for a semiconductor device according to claim 4, wherein the surface of the heater electrode that touches the electrode part is not coated with the SiC film, and a surface of the electrode part that touches the heater electrode is not coated with the SiC film.

6. The manufacturing apparatus for a semiconductor device according to claim 1, wherein the heater electrode and the electrode part are connected by using a bolt.

7. The manufacturing apparatus for a semiconductor device according to claim 1, wherein the heater element includes an in-heater located under the wafer and an out-heater located under an outer periphery of the wafer.

8. The manufacturing apparatus for a semiconductor device according to claim 1, wherein a surface of the heater electrode is coated with an SIC film except the surface of the heater electrode that touches the electrode part.

9. The manufacturing apparatus for a semiconductor device according to claim 1, further comprising a separation plate configured to partition between the surface of the heater electrode that touches the electrode part and the heater element.

10. The manufacturing apparatus for a semiconductor device according to claim 9, wherein the separation plate has an opening which the heater electrode penetrates through the separation plate.

11. The manufacturing apparatus for a semiconductor device according to claim 9, further comprising:
    a purge gas inlet configured to purge gas under the separation plate; and
    a purge gas outlet configured to discharge the purge gas.

12. The manufacturing apparatus for a semiconductor device according to claim 11, wherein the purge gas is H2 or inert gas.

13. The manufacturing apparatus for a semiconductor device according to claim 1, wherein the heater shaft is extended to outside of the chamber.

* * * * *

UNITED STATES PATENT AND TRADEMARK OFFICE
CERTIFICATE OF CORRECTION

PATENT NO.        : 9,093,484 B2
APPLICATION NO.   : 12/853107
DATED             : July 28, 2015
INVENTOR(S)       : Suzuki et al.

Page 1 of 1

It is certified that error appears in the above-identified patent and that said Letters Patent is hereby corrected as shown below:

Title page, item (57), in the Abstract, lines 10-11, change "configured to applied a voltage" to --configured to apply a voltage--.

Signed and Sealed this
Twenty-sixth Day of January, 2016

Michelle K. Lee
*Director of the United States Patent and Trademark Office*